United States Patent
Nishi et al.

(10) Patent No.: US 7,489,519 B1
(45) Date of Patent: Feb. 10, 2009

(54) POWER AND GROUND RING SNAKE PATTERN TO PREVENT DELAMINATION BETWEEN THE GOLD PLATED RING AND MOLD RESIN FOR WIREBOND PBGA

(75) Inventors: Sayaka Nishi, Yamato (JP); Takashi Hisada, Hachiouji (JP); Yasushi Takeoka, Sagamihara-City (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/103,510

(22) Filed: Apr. 15, 2008

(51) Int. Cl.
*H01R 9/00* (2006.01)

(52) U.S. Cl. .................. 361/772; 361/770; 361/775; 361/777; 361/782

(58) Field of Classification Search ......... 361/770–777, 361/782–785, 792–795; 174/259–264; 257/690–694, 257/728–730
See application file for complete search history.

(56) References Cited

U.S. PATENT DOCUMENTS

| | | | |
|---|---|---|---|
| 5,545,923 A * | 8/1996 | Barber | 257/691 |
| 5,672,909 A * | 9/1997 | Glenn et al. | 257/668 |
| 5,686,699 A * | 11/1997 | Chu et al. | 174/542 |
| 5,726,860 A | 3/1998 | Mozdzen | |
| 5,801,440 A | 9/1998 | Chu et al. | |
| 5,895,967 A * | 4/1999 | Stearns et al. | 257/691 |
| 5,903,050 A * | 5/1999 | Thurairajaratnam et al. | 257/695 |
| 5,982,632 A * | 11/1999 | Mosley et al. | 361/775 |
| 6,064,113 A * | 5/2000 | Kirkman | 257/691 |
| 6,212,077 B1 * | 4/2001 | Brown et al. | 361/777 |
| 6,380,048 B1 | 4/2002 | Boon et al. | |
| 6,424,032 B1 * | 7/2002 | Ikemoto et al. | 257/691 |
| 6,449,169 B1 | 9/2002 | Ho et al. | |
| 6,528,872 B2 | 3/2003 | Chang | |
| 6,545,348 B1 * | 4/2003 | Takano | 257/691 |
| 6,897,555 B1 * | 5/2005 | Lim et al. | 257/692 |
| 2002/0145193 A1 | 10/2002 | Beaulieu et al. | |
| 2005/0205990 A1 | 9/2005 | Wang et al. | |

* cited by examiner

Primary Examiner—Tuan T Dinh
(74) Attorney, Agent, or Firm—Jackson Patent Law Office

(57) ABSTRACT

An exemplary ball grid array package for a semiconductor device includes an integrated circuit on a substrate, and a first bus on the substrate, the first bus including first portions that extend substantially parallel to the integrated circuit, interleaved with second portions that extend substantially toward the integrated circuit, each second portion having an end contiguous with a first portion and another end contiguous with a another first portion. A first set of wires connects the first bus with a first plurality of nodes on the integrated circuit. The package also includes a second bus and a second set of wires.

1 Claim, 4 Drawing Sheets

POWER AND GROUND RING SNAKE PATTERN TO PREVENT DELAMINATION BETWEEN THE GOLD PLATED RING AND MOLD RESIN FOR WIREBOND PBGA

BACKGROUND OF THE INVENTION

1. Field of the Invention

This invention relates generally to electronic circuits and, more particularly, to systems and methods of packaging electronic circuits.

2. Description of Related Art

The power source and ground busses on the substrate of a wirebond BGA package are typically ring-shaped. The area of the gold plated ring is large, and the adhesion between the gold and the molded resin is weak. As a result, delamination can easily occur. Delamination on the ring may disconnect the wirebond bonding area.

SUMMARY OF THE INVENTION

To address the problem above, a ball grid array package comprises an array of conductive balls; a substrate; an integrated circuit on the substrate; a first bus on the substrate, the first bus including first portions that extend substantially parallel to the integrated circuit, interleaved with second portions that extend substantially toward the integrated circuit, each second portion having an end contiguous with a first portion and another end contiguous with a another first portion; a first set of wires connecting the first bus with a first plurality of nodes on the integrated circuit; a second bus on the substrate, the second bus including first portions that extend substantially parallel to the integrated circuit, interleaved with second portions that extend substantially toward the integrated circuit, each second portion having an end contiguous with a first portion and another end contiguous with another first portion; a second set of wires connecting the second bus with a second plurality of nodes on the integrated circuit; a plurality of pads on the substrate, each of the plurality of pads contiguous with a respective conductive ball; and a third of wires each connecting a respective pad to a respective one of the third plurality of nodes on the integrated circuit.

BRIEF DESCRIPTION OF THE DRAWINGS

References are made to the following text taken in connection with the accompanying drawings, in which.

The accompanying drawings which are incorporated in and which constitute a part of this specification, illustrate embodiments of the invention and, together with the description, explain the principles of the invention, and additional advantages thereof. Certain drawings are not necessarily to scale, and certain features may be shown larger than relative actual size to facilitate a more clear description of those features. Throughout the drawings, corresponding elements are labeled with corresponding reference numbers.

DETAILED DESCRIPTION OF EXEMPLARY EMBODIMENTS

Figure 1:
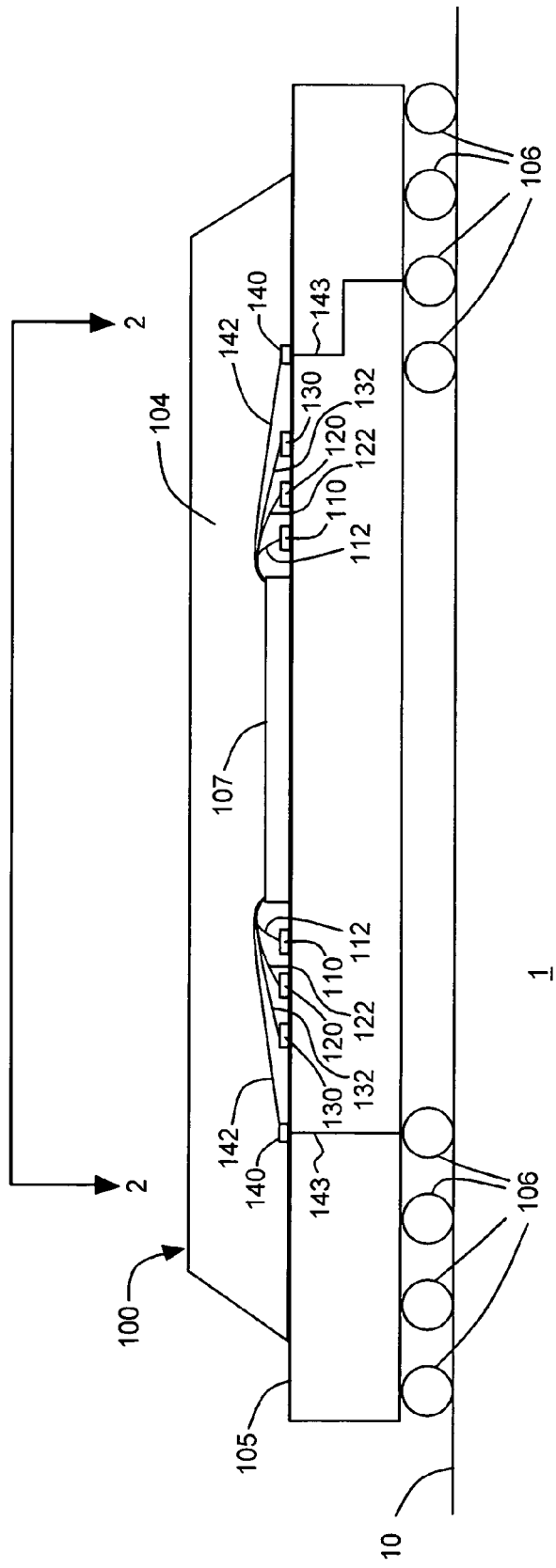
FIG. 1 shows a first exemplary system 1, according to an exemplary embodiment of the present invention.

FIG. 1 shows a first exemplary system 1, according to an exemplary embodiment of the present invention. System 1 is a cellular telephone.

Figure 2:
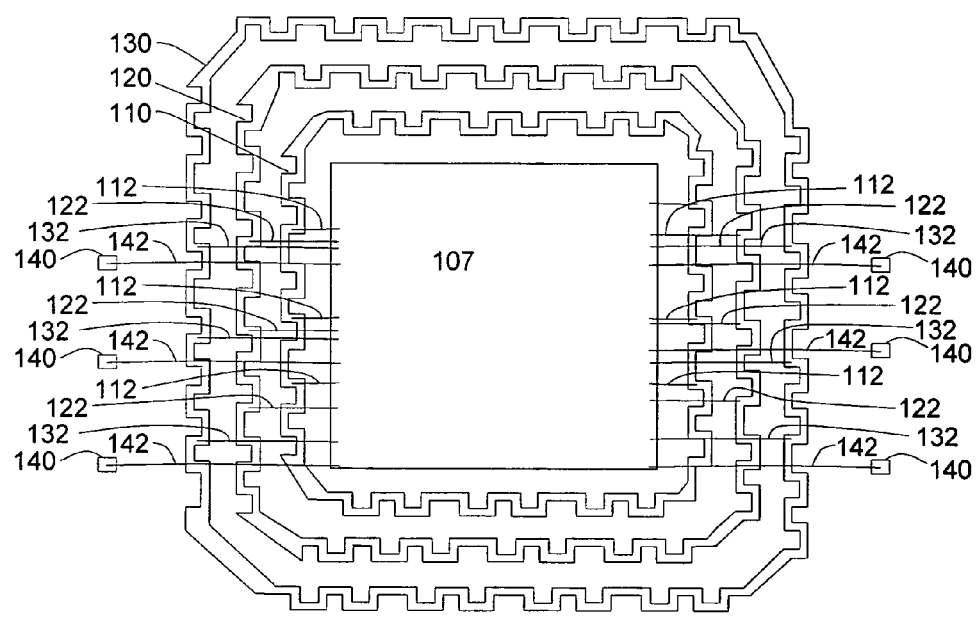
FIG. 2 is a view taken looking in the direction of the line 2-2 in FIG. 1.

FIG. 2 is a view taken looking in the direction of the line 2-2 in FIG. 1.

Ball grid array (BGA) package 100 includes a printed circuit board substrate 105. A silicon chip integrated circuit (IC) 107 is mechanically bonded to the substrate 105. Gold wires 112 electrically connect circuit nodes on the IC 107 to a ground bus 110. Ground bus 110 includes portions that extend parallel to the IC 107, interleaved with portions that extend perpendicular to the IC 107. Gold wires 112 are connected at the portions that extend perpendicular to the IC 107.

Gold wires 122 electrically connect circuit nodes on the IC 107 to a Vdd bus 120. Vdd bus 120 includes portions that extend parallel to the IC 107, interleaved with portions that extend perpendicular to the IC 107. Gold wires 122 are connected at the portions of bus 120 that extend perpendicular to the IC 107.

The portions of the bus 120 that extend perpendicular to the IC 107 are staggered with respect to the portions of the bus 110 that extend perpendicular to the IC 107. The portions of the bus 120 that extend perpendicular to the IC 107 are not interdigitated or intererleved with respect to the portions of the bus 110 that extend perpendicular to the IC 107.

Gold wires 132 electrically connect circuit nodes on the IC 107 to a Vddx bus 130. Vddx bus 130 includes portions that extend parallel to the IC 107, interleaved with portions that extend perpendicular to the IC 107. Gold wires 132 are connected at the portions of bus 130 that extend perpendicular to the IC 107.

The portions of the bus 130 that extend perpendicular to the IC 107 are staggered with respect to the portions of the bus 120 that extend perpendicular to the IC 107. The portions of the bus 130 that extend perpendicular to the IC 107 are not interdigitated or intererleved with respect to the portions of the bus 120 that extend perpendicular to the IC 107.

Gold wires 142 electrically connect circuit nodes on the IC 107 to signal pads 140.

To promote clarity, FIGS. 1 and 2 show only a small subset of the connections in package 100; most of the connections have been omitted from the drawings.

The wire bond busses and pads are connected to vias to the bottom side of the substrate 105 and then to spherical solder balls (circular solder pads) 106. The bottomside solder balls 106 are laid out on a square or rectangular grid with a constant pitch, thereby electrically connecting IC 107 to other circuits on circuit board 10 of the cellular telephone 1.

An overmold 104 covers IC 107, wires, and substrate busses and pads.

Figure 3:
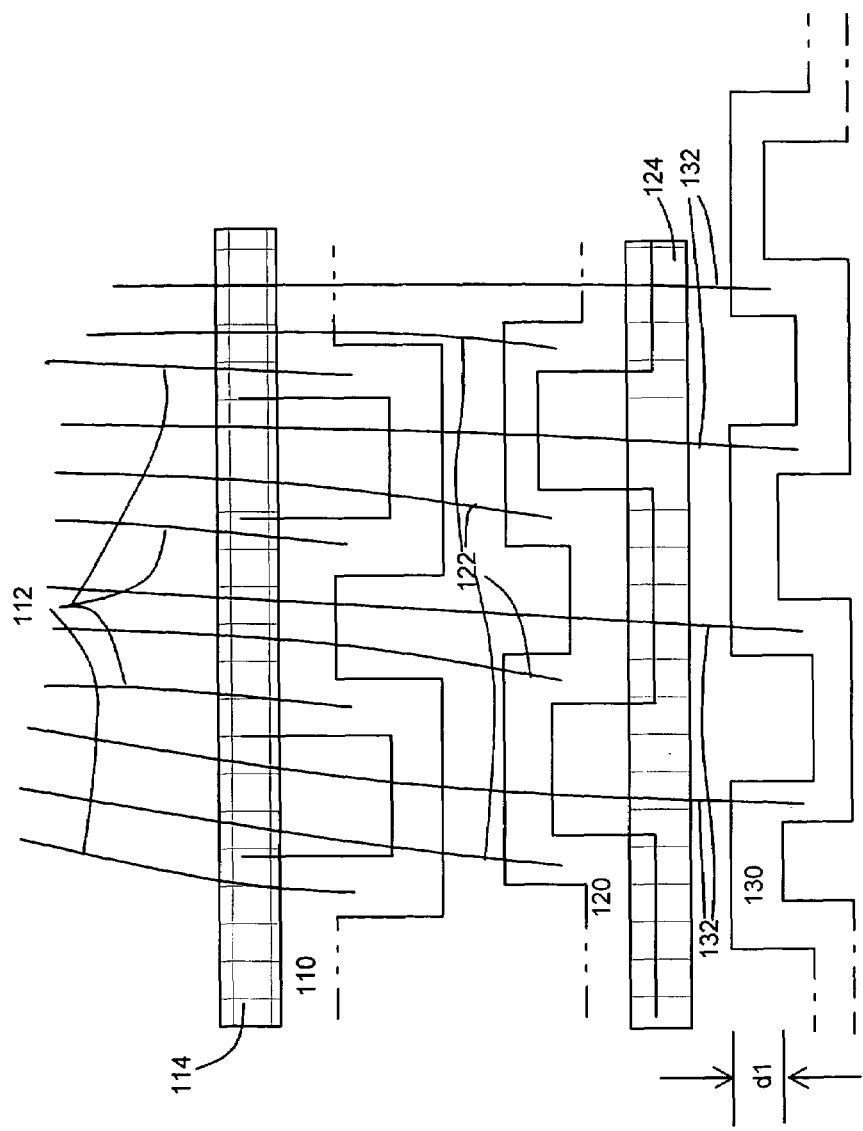
FIG. 3 is an enlarged plan view of a portion of the structure shown in FIG. 2.

FIG. 3 is an enlarged plan view of a portion of the structure shown in FIG. 2. Dimensions such as d1 could be 70 micrometers, for example. Hatched areas 114 and 124 represent solder mask coating to prevent oxidation generally.

Bus 110 may be conceptualized as including first portions that extend substantially parallel to the integrated circuit, interleaved with second portions that extend substantially toward the integrated circuit, each second portion having an end contiguous with (integral with) a first portion and another end contiguous with (integral with) a another first portion.

A first set of wires 112 connects the bus 110 with a first plurality of nodes on IC 107.

Bus 120 may be conceptualized as including first portions that extend substantially parallel to the integrated circuit, interleaved with second portions that extend substantially toward the integrated circuit, each second portion having an end contiguous with (integral with) a first portion and another end contiguous with (integral with) another first portion.

A set of wires 122 connects the second bus with a second plurality of nodes on IC 107.

Each of pads 140 is connected to a respective solder ball 106.

Each one of a set of wires 142 connects a respective pad 140 to a respective one of a third plurality of nodes on the integrated circuit.

In summary, in order to reduce the ring area, the Applicants developed a snake pattern while keeping the same wirebonding portion. Also, pads are connected between the top and bottom so that adhesion between the mold and gold plating interfaces can be supported by the peripheral mold and substrate resin, which is not possible by one straight, thin ring, while maintaining the same functionality as conventional rings.

The snake pattern ring includes a normal rings and wirebond wiring with the AuNi platting extracted from both sides. However, rings are connected while maintaining the bonding area.

The Applicants conducted reliability tests using actual substrates with the new design. SAT (ultrasonographic equipment) results showed that with the conventional design, delamination occurred in 53% of packages. However, no delamination was found in packages with the snake ring design.

Figure 4:
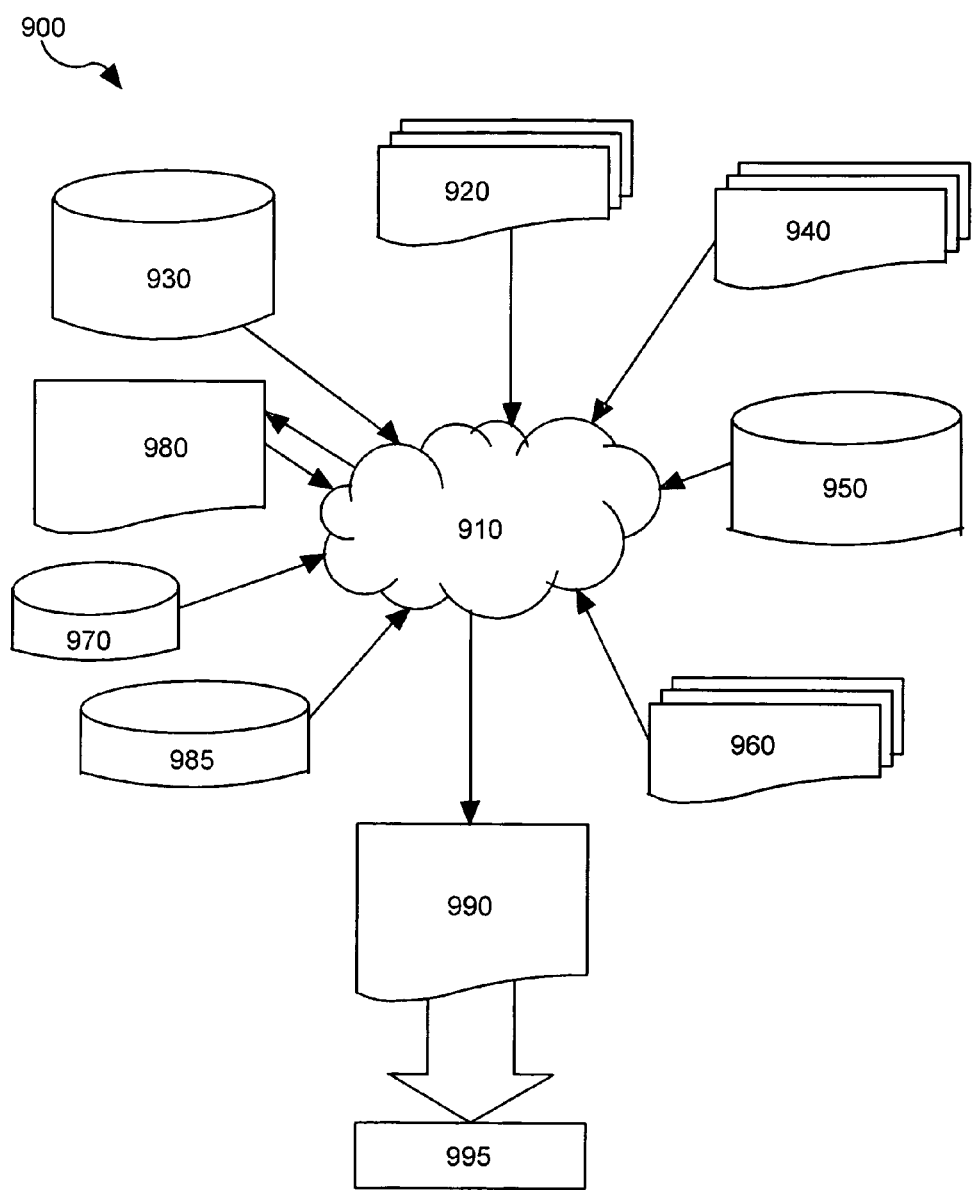
FIG. 4 is a flow diagram of a design process used in semiconductor design, manufacture, and/or test.

FIG. 4 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 1, 2, and 3 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in FIGS. 1, 2, and 3. Design process 910 preferably synthesizes (or translates) an embodiment of the invention as shown in FIGS. 1, 2, and 3 into a netlist 980, where netlist 980 is, for example, a list of wires, transistors, logic gates, control circuits, I/O, models, etc. that describes the connections to other elements and circuits in an integrated circuit design and recorded on at least one of machine readable medium. This may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow. Design process 910 preferably translates an embodiment of the invention as shown in FIGS. 1, 2, and 3, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 2, and 3. Design structure 990 may then proceed to a stage 995 where, for example, design structure 990: proceeds to tape-out, is released to manufacturing, is released to a mask house, is sent to another design house, is sent back to the customer, etc.

Additional advantages and modifications will readily occur to those skilled in the art. The invention in its broader aspects is therefore not limited to the specific details, representative apparatus, and illustrative examples shown and described. Accordingly, departures may be made from such details without departing from the spirit or the scope of Applicants' general inventive concept. The invention is defined in the following claims. In general, the words "first," "second," etc., employed in the claims do not necessarily denote an order.

What is claimed is:

1. A ball grid array package comprising:
   an array of conductive balls;
   a substrate;
   an integrated circuit on the substrate;
   a first bus on the substrate, the first bus including first portions that extend substantially parallel to the integrated circuit, interleaved with second portions that extend substantially toward the integrated circuit, each second portion having an end contiguous with a first portion and another end contiguous with a another first portion;
   a first set of wires connecting the first bus with a first plurality of nodes on the integrated circuit;
   a second bus on the substrate, the second bus including first portions that extend substantially parallel to the integrated circuit, interleaved with second portions that extend substantially toward the integrated circuit, each second portion having an end contiguous with a first portion and another end contiguous with another first portion;
   a second set of wires connecting the second bus with a second plurality of nodes on the integrated circuit;
   a plurality of pads on the substrate, each of the plurality of pads connected to a respective conductive ball; and
   a third set of wires each connecting a respective pad to a respective one of a third plurality of nodes on the integrated circuit.

* * * * *